United States Patent [19]

Kataoka et al.

[11] Patent Number: 5,814,425
[45] Date of Patent: Sep. 29, 1998

[54] METHOD OF MEASURING EXPOSURE CONDITION AND/OR ABERRATION OF PROJECTION OPTICAL SYSTEM

[75] Inventors: Yoshiharu Kataoka; Tetsuya Mori, both of Utsunomiya, Japan

[73] Assignee: Canon Kabushiki Kaisha, Tokyo, Japan

[21] Appl. No.: 520,746

[22] Filed: Aug. 29, 1995

[30] Foreign Application Priority Data

Sep. 2, 1994 [JP] Japan .................................. 6-209800

[51] Int. Cl.$^6$ .................................. H01L 21/027
[52] U.S. Cl. .......................... 430/30; 430/22; 355/77; 356/372; 356/401
[58] Field of Search .................. 430/30, 22; 356/372, 356/401; 355/77

[56] References Cited

U.S. PATENT DOCUMENTS 5,124,216  6/1992  Giapis et al. .............................. 430/30
5,434,026  7/1995  Takatsu et al. ............................ 430/30
5,476,738  12/1995  Yuan ......................................... 430/30

FOREIGN PATENT DOCUMENTS

1-278018    11/1989  Japan ..................................... 356/372
3-266449    11/1991  Japan ....................................... 430/30
WO 92/15923  9/1992  WIPO ....................................... 430/30

*Primary Examiner*—Martin Angebranndt
*Attorney, Agent, or Firm*—Fitzpatrick, Cella, Harper & Scinto

[57] ABSTRACT

A method of measuring an exposure condition for transfer of a pattern onto a photosensitive substrate or aberration of a projection optical system is disclosed, wherein the pattern is transferred onto the photosensitive substrate plural times in different exposure conditions, to form photosensitive patterns on the photosensitive substrate, and images of the photosensitive patterns are picked up. Frequency components of the photosensitive patterns are calculated from corresponding imagewise signals, and an optimum exposure condition for transfer of the pattern onto the photosensitive substrate is determined on the basis of the frequency components of the photosensitive patterns.

15 Claims, 9 Drawing Sheets

FIG. 3(A) FIG. 3(B) FIG. 3(C) BEST FOCUS POSITION

FIG. 3(D) FIG. 3(E) FIG. 3(F) DEFOCUS POSITION

EXPOSURE SMALL ↔ EXPOSURE LARGE

FIG. 10(A) DEFOCUS (−)

FIG. 10(B) BEST FOCUS POSITION

FIG. 10(C) DEFOCUS (+)

METHOD OF MEASURING EXPOSURE CONDITION AND/OR ABERRATION OF PROJECTION OPTICAL SYSTEM

FIELD OF THE INVENTION

This invention relates to a method of measuring an exposure condition of an exposure apparatus or aberration of a projection optical system of an exposure apparatus, which apparatus is usable particularly in a lithographic process for manufacture of microdevices such as LSIs, for example.

DESCRIPTION OF THE RELATED ART

In this type of exposure apparatuses, in order to increase in the degree of integration of a circuit pattern and to decrease the line width of the pattern transferred, into the range of submicron, it is very important to accurately set exposure amount conditions and focus conditions to maintain the resolution of a projection lens stably.

Conventionally, for every shot, at least one of the exposure conditions such as focus position and exposure amount (shutter time) is changed. After printing patterns on a photosensitive substrate, the substrate is developed. The line widths of straight patterns are measured through an optical microscope or any other line width measuring device, and optimum exposure conditions are determined.

For example, in a step-and-repeat type exposure apparatus, with regard to a lateral direction of the array of shot areas on a wafer, the exposure process may be executed with a constant focal value while sequentially changing the exposure amount (shutter time) by a fixed amount. As regards the longitudinal direction of the shot array, the exposure process may be executed with constant exposure amount while sequentially changing the focus value by a fixed amount.

The line width of resist patterns (line-and-space patterns) in the shot areas formed after a developing process, may be measured by using an SEM measuring apparatus having a scanning electron microscope, for example, and an optimum focal point position of a projection lens as well as an optimum exposure amount can be determined.

In such method, however, because of measurement of the line widths of resist patterns through SEM, for example, it takes a long processing time. Also, the cost of the apparatus is very high.

SUMMARY OF THE INVENTION

It is an object of the present invention to provide a method of measuring an optimum exposure condition appropriate of the type of a resist used, quickly and precisely, and/or a method of measuring aberration of a projection optical system quickly and precisely.

Basically, the present invention relies on the principle that, when a line-and-space pattern is transferred, the duty of a resist pattern (the ratio in length of the line and the space) at (1) optimum focal point position and (2) optimum exposure amount, satisfies 1:1.

Thus, in the present invention, a reticle (R) comprises a mask formed with an exposure condition measuring pattern having a periodicity (line and space duty 1:1) in a direction, and images of such reference pattern are sequentially printed on a wafer (W) while changing at least one condition of the exposure amount and the focus position.

After development, images of resist patterns are picked up by a CCD camera. A one-dimensional signal, obtainable by integrating an imagewise signal in one direction, is transformed into a spatial frequency region. Then, by calculating the intensity of the spatial frequency produced in that region by the pattern, the duty of a line-and-space resist image is detected. With this procedure, it is possible to determine the optimum focal point position of the projection optical system and the optimum exposure amount quickly and precisely.

In accordance with an aspect of the present invention, there is provided a method of measuring an exposure condition for transfer of a pattern onto a photosensitive substrate, the method includes: a pattern forming step for transferring the pattern onto the photosensitive substrate plural times in different exposure conditions, to form photosensitive patterns on the photosensitive substrate; an image picking-up step for picking up images of the photosensitive patterns; a calculating step for calculating frequency components of the photosensitive patterns, from imagewise signals obtained by said image picking-up step; and a determining step for determining an optimum exposure condition for transfer of the pattern onto the photosensitive substrate, on the basis of the frequency components of the photosensitive patterns.

In one preferred form of this aspect of the present invention, the photosensitive substrate comprises a wafer coated with a resist.

In another preferred form of this aspect of the present invention, each of the photosensitive patterns comprises a resist pattern to be formed after a developing process.

In a further preferred form of this aspect of the present invention, each of the photosensitive patterns comprises a latent image formed in a portion of a resist layer prior to a developing process.

In a yet further preferred form of this aspect of the present invention, the patter to be transferred comprises a pattern having a periodicity.

In a still further preferred form of this aspect of the present invention, the method further includes a second determining step for determining an optimum exposure condition, on the basis of a power of a basic frequency, of the frequency components of the photosensitive patterns, as determined by the periodic pattern.

In a further preferred form of this aspect of the present invention, the exposure condition includes exposure amount as a parameter.

In a further preferred form of this aspect of the present invention, the pattern is transferred to the photosensitive substrate through a projection optical system, and wherein the exposure condition includes a position of the photosensitive substrate with respect to an optical axis direction of the projection optical system.

In accordance with another aspect of the present invention, there is provided a method of measuring aberration of a projection optical system including a pattern forming step for transferring a pattern of a reticle onto a photosensitive substrate plural through the projection optical system to form a photosensitive pattern on the photosensitive substrate; an image picking-up step for picking up an image of the photosensitive pattern; a calculating step for calculating a frequency component of the photosensitive pattern, from an imagewise signal obtained by said image picking-up step; and a determining step for determining the aberration of the projection optical system, on the basis of the frequency component of the photosensitive pattern.

In a preferred form of this aspect of the present invention, the photosensitive substrate comprises a wafer coated with a resist.

In another preferred form of this aspect of the present invention, the photosensitive pattern comprises a resist pattern to be formed after a developing process.

In a further preferred form of this aspect of the present invention, the photosensitive pattern comprises a latent image formed in a portion of a resist layer prior to a developing process.

In a yet further preferred form of this aspect of the present invention, the reticle has plural patterns to be transferred, and the pattern are disposed at different positions on the reticle.

In still further preferred form of this aspect of the present invention, the pattern comprises a pattern having periodicity.

In a further preferred form of this aspect of the present invention, the method further includes a second determining step for determining the aberration of the projection optical system, on the basis of a phase of the frequency component of the photosensitive pattern.

In a further preferred form of this aspect of the present invention, the method further comprises a pattern forming step for transferring plural patterns on the photosensitive substrate at different positions being different with respect to an optical axis direction of the projection optical system, to form photosensitive patterns on the photosensitive substrate.

In a further preferred form of this aspect of the present invention, the method further comprises a third determining step for determining a position of an image plane of the projection optical system, on the basis of a power of a basic frequency, of the frequency components of the photosensitive patterns, as determined by the periodic pattern.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
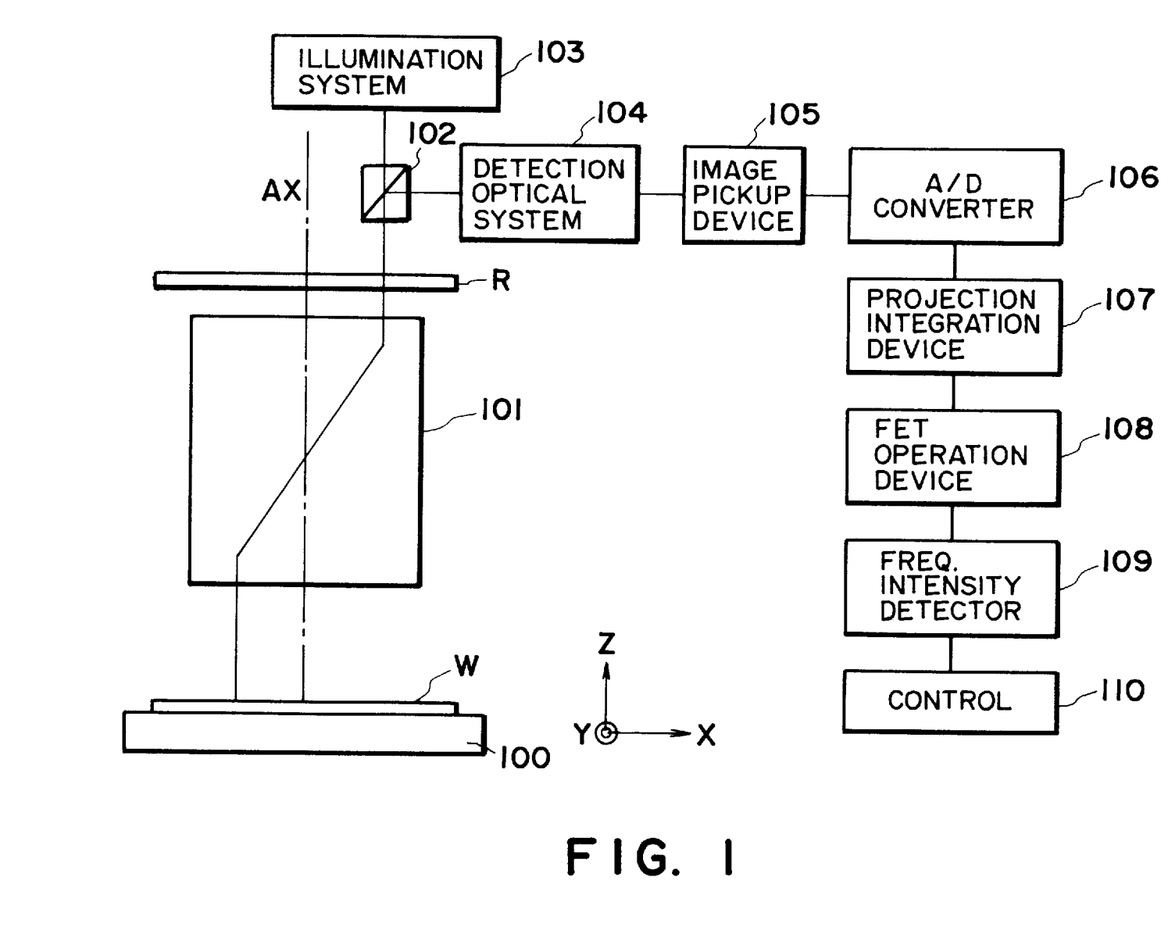
FIG. 1 is a schematic and diagrammatic view for explaining the structure of an exposure condition measuring system according to the present invention.

Now, the present invention will be described with reference to embodiments illustrated in the drawings. FIG. 1 shows a first embodiment of an exposure apparatus which includes an arrangement for performing exposure condition measurement in accordance with the present invention.

In FIG. 1, denoted at 101 is a reduction projection lens for projecting a circuit pattern on the surface of a reticle R onto a wafer W. The optical axis of it is denoted by AX. The optical axis AX is parallel to Z direction in the drawing. Denoted at 100 is a wafer stage for attracting the wafer W thereto and for moving it in X and Y directions as well as in the Z direction.

Figure 2:
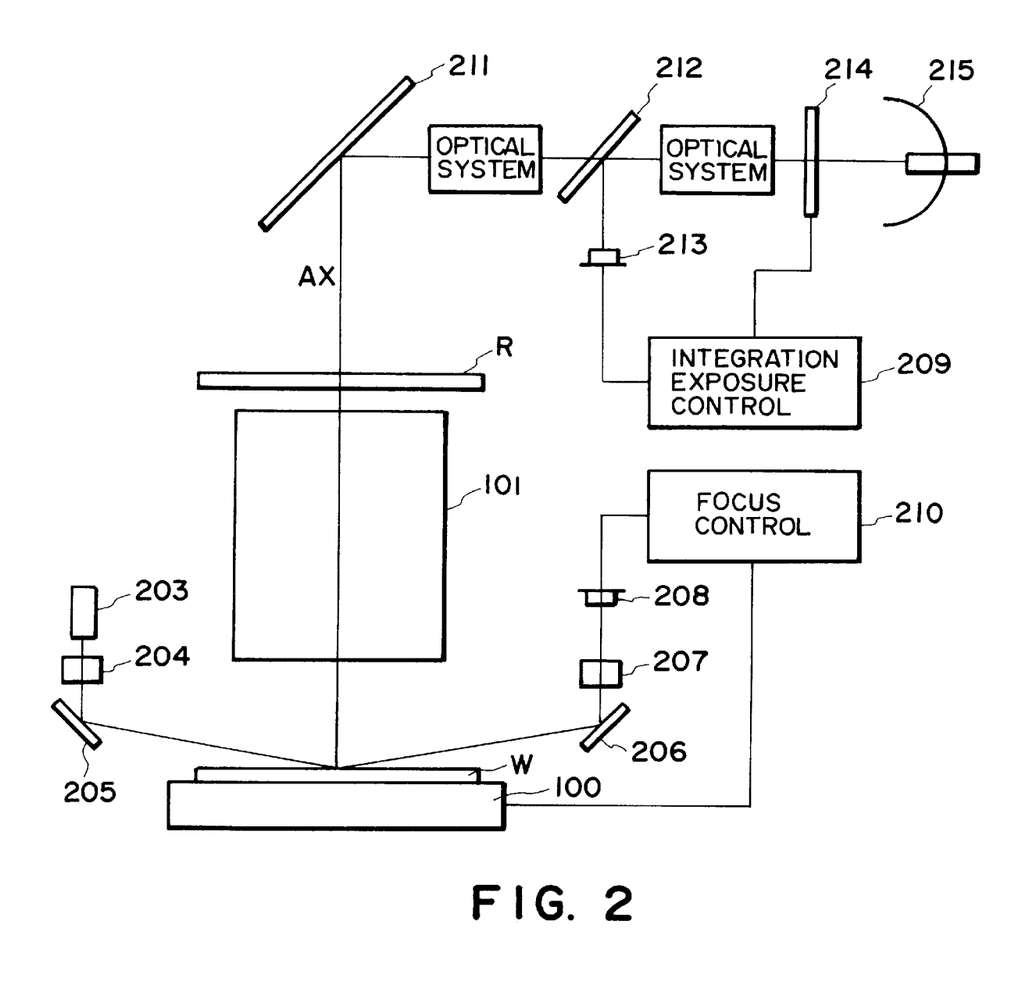
FIG. 2 is a schematic and diagrammatic view of a portion of an exposure apparatus, for explaining focus detection and exposure amount control therein.
Figure 3A:
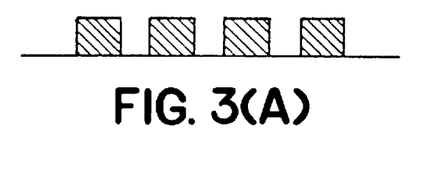
FIGS. 3(A)–3(F) are schematic views for explaining in section the patterns formed in a resist.
Figure 3B:
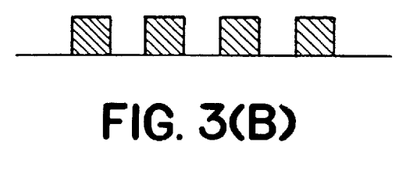
Figure 3C:
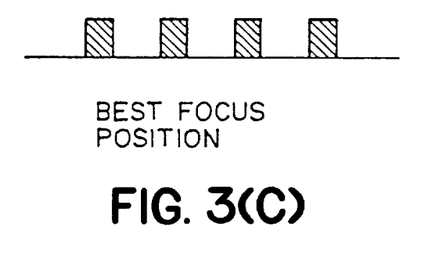
Figure 3D:
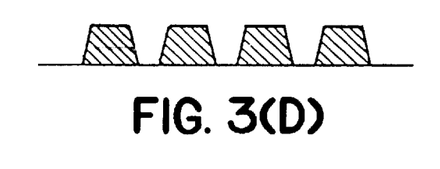
Figure 3E:
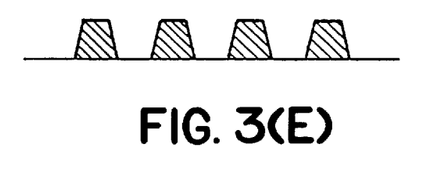
Figure 3F:
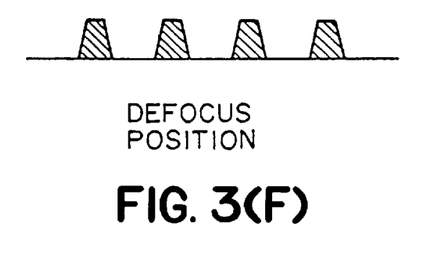

The exposure apparatus is equipped with a focus position controlling device and an exposure amount controlling device. FIG. 2 is a schematic and partial view for explaining the focus position controlling device and the exposure amount controlling device. The focus position control will be explained first.

Denoted at 203 is a high luminance light source such as a semiconductor laser. Denoted at 204 is an illumination optical system. Light from the light source is directed by the illumination optical system through a pinhole, and then the light is deflected by a deflecting mirror 205. The deflected light is projected on the surface of the wafer W. The light deflected at the measurement point on the wafer W is deflected by a deflecting mirror 206, and after this, it is projected through a position detecting optical system 207 onto a two-dimensional position detecting device 208. The position detecting device 208 comprises a CCD, for example, and it serves to detect the position of incidence. Any change in position of the wafer W in the direction of the optical axis AX of the projection lens 101 can be detected as a deviation of the incidence position upon the two-dimensional position detecting device 208, such that the position of the wafer stage in the optical axis AX direction can be controlled on the basis of an output signal of the position detecting device 208.

Now, the exposure amount control will be explained. Denoted at 215 is a light source which comprises a Hg lamp, for example. Denoted at 214 is a shutter which is openable and closable. Denoted at 213 is a sensor for detecting the illuminance. The illuminance of exposure light is measured by using this sensor, and an integration exposure control device controls the opening/closing time of the shutter to assure constant exposure amount.

Referring back to FIG. 1, a reticle R having a pattern M (FIG. 4) is placed in position within the exposure apparatus, and a wafer coated with a positive type resist is also placed in position. Through a step-and-repeat process, images of the pattern M are sequentially printed on the wafer. During this process, the focus control device and exposure amount control device are used to change the set exposure amount in accordance with the shot position in the X direction and also to change the focus offset sequentially by a fixed amount with regard to the Y direction.

FIGS. 3(A)–3(F) show sections of resist patterns of a wafer after development. Patterns 3(A)–3(C) are those provided at the optimum focal point position and with changed exposure amounts. Patterns 3(D)–3(F) are those provided at a defocused position and with changed exposure amounts.

Then, the wafer having been developed is placed on the wafer stage 100, and the illumination system 103 illuminates the resist patterns of the pattern M as formed on the wafer W. Denoted at 102 is a half mirror, and denoted at 104 is a detection optical system for imaging the resist pattern of the pattern M, upon an image pick-up surface of an image pick-up device 105 at a predetermined magnification.

The image pick-up device 105 comprises a photoelectrically converting device such as an ITV or a two-dimensional image sensor, for example, and it serves to transform a picked image into a two-dimensional signal.

Figure 4:
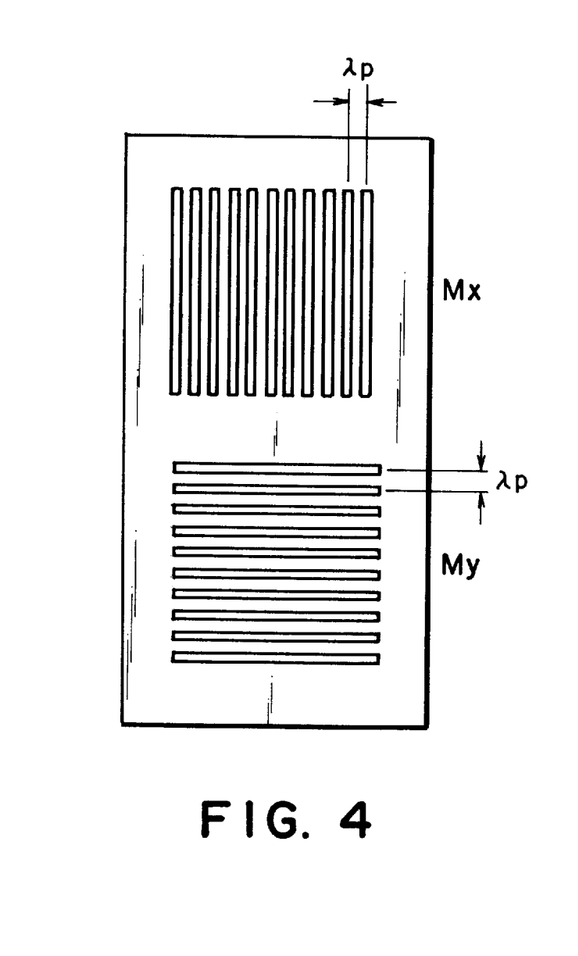
FIG. 4 is a view for explaining a pattern to be formed on a mask, being the subject of exposure condition measurement according to the present invention.

FIG. 4 shows a measurement pattern formed on a reticle as described. It comprises rectangular patterns of chromium, having the same width and extending in the X and Y directions, respectively, in parallel to each other as illustrated.

Figure 5:
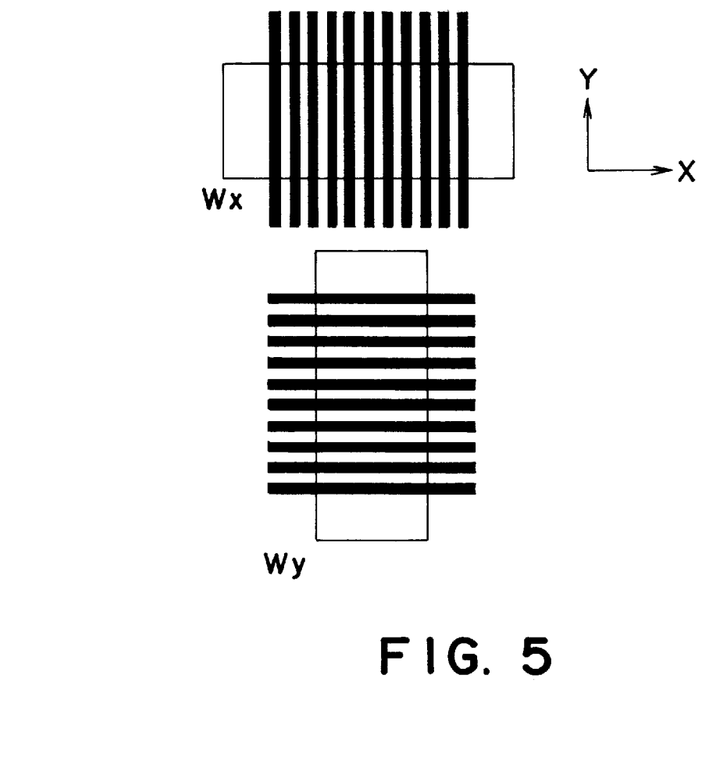
FIG. 5 is a view for explaining the relation between a two-dimensional window and a pattern formed on a wafer.
Figure 6A:
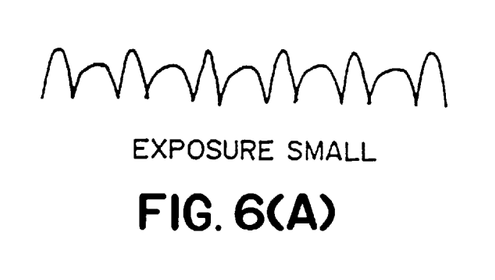
FIGS. 6(A)–6(C) are views for explaining examples of projection and integration signals produced when images of patterns printed with different focus positions are picked up by a CCD camera.
Figure 6B:
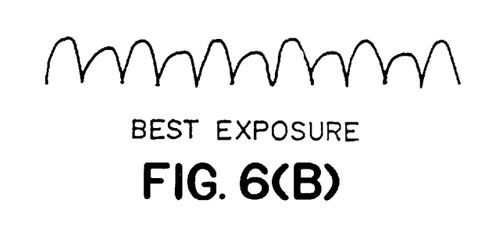
Figure 6C:
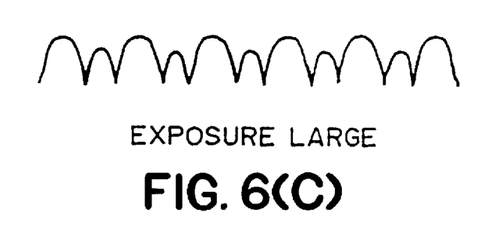

The pattern image as transformed by the image pick-up device 105 into a two-dimensional electric signal, is transformed by an analog-to-digital converter 106 into a two-dimensional discrete electric signal train corresponding to the X and Y addresses of picture elements of the two-dimensional device, with a sampling pitch $\lambda s$ as determined by the picture element pitch on the image pick-up surface as well as the optical magnification of the detection optical system 104 and the projection optical system 101. Denoted at 107 is a projection and integration device. It serves to set a predetermined two-dimensional window such as including the resist pattern of the pattern (Mx), as shown in FIG. 5 and, after it, it executes picture element integration within the window Wx along the Y direction, such that an electric signal train S(x) being discrete in the X direction such as shown in FIG. 6 is outputted. Denoted at 108 is an FFT computing device for performing discrete Fourier transformation to a received electric signal train s(x), to transform s(x) into spatial frequency region, and to calculate its Fourier coefficient quickly. The procedure relies on high-speed Fourier transformation (FFT) of N point (N=2$^r$) which is known per se. If the sampling frequency is put as fs=1 and where the complex Fourier coefficient of the frequency fk=k/N is denoted by Xk, then:

$$XK = \sum_{n=0}^{N-1} s(x)\exp(-j \cdot 2 \cdot \pi \cdot k \cdot n/N)$$

wherein j is imaginary unit. If the strength of the spatial frequency fk at there is denoted by pk, then $$pk = \sqrt{(Re(Xk))^2 + (Im(Xk))^2}$$

where Re(Xk) and Im(Xk) are real and imaginary portions of the complex number Xk.

Here, there is a relation that, if the pattern pitch of the pattern (M) is p, the strength of the spatial frequency f1p=$\lambda$s/$\lambda$p becomes larger, and also the strength of the n-th harmonics fnp=n·f1p (n=2, 3, 4, . . . ) of f1p becomes larger.

Figure 7:
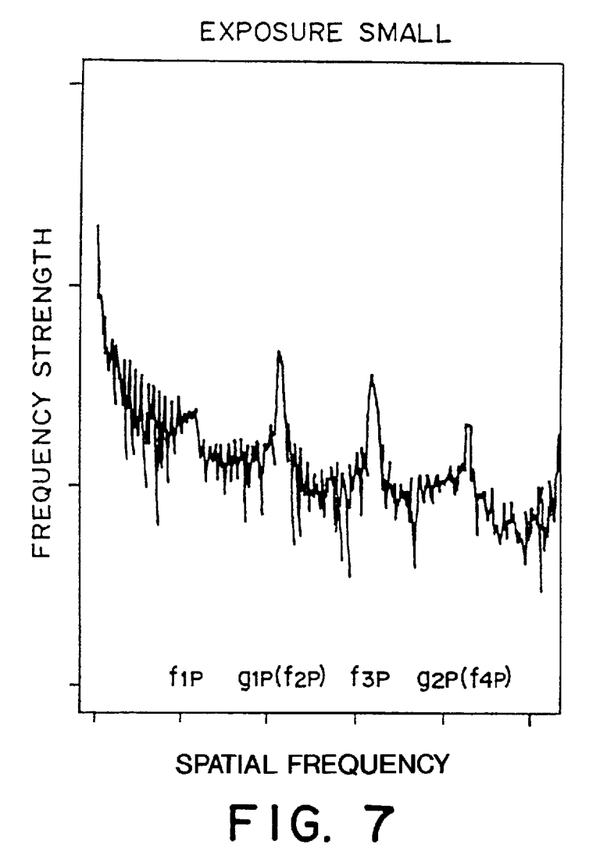
FIG. 7 is a graph wherein projection and integration signals of a pattern, transferred at a (−) defocus position, as having been discrete-Fourier transformed through a FFT computing device, are plotted while taking the frequency strength on the axis of the ordinate and taking the spatial frequency on the axis of the abscissa.
Figure 8:
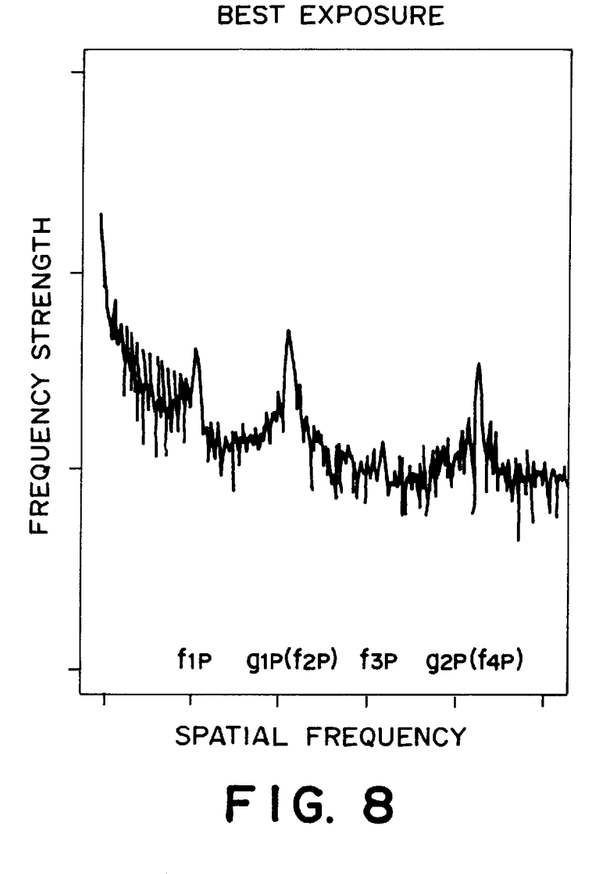
FIG. 8 is a graph wherein projection and integration signals of a pattern, transferred at a (+) defocus position, as having been discrete-Fourier transformed through a FFT computing device, are plotted while taking the frequency strength on the axis of the ordinate and taking the spatial frequency on the axis of the abscissa.
Figure 9:
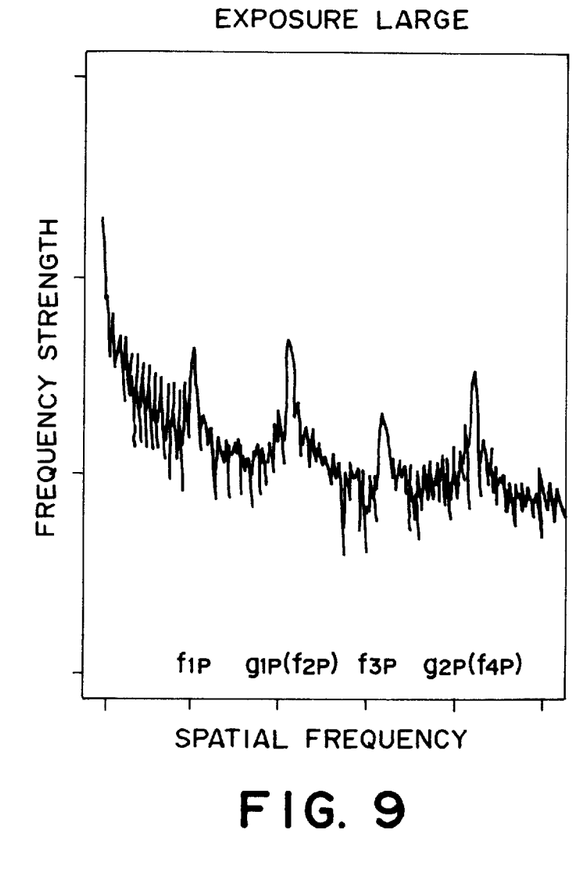
FIG. 9 is a graph wherein projection and integration signals of a pattern, transferred at a optimum focal point position, as having been discrete-Fourier transformed through a FFT computing device, are plotted while taking the frequency strength on the axis of the ordinate and taking the spatial frequency on the axis of the abscissa.

FIGS. 6(A)–6(C) show examples of projection and integration signals produced when images of patterns as printed with different focus positions are picked up by a CCD camera. FIGS. 7–9 show results of discrete Fourier transformation made through the FFT device to those signals. At the optimum focal position, if the ratio of line and space, that is, the duty of the line-and-space pattern provided on the reticle (R) is 1:1, also in the resist pattern the power of the spatial frequency g1p=2$\lambda$s/$\lambda$p becomes larger and the power of gnp=n·g1p (n=2, 3, 4, . . . ) also becomes larger. However, in defocused state, the duty of the line and space becomes out of 1:1 and, therefore, the power of the frequency at n times the basic frequency f1p (in this case, f3p) becomes large. It become smallest at the optimum focal point position.

Figure 14:
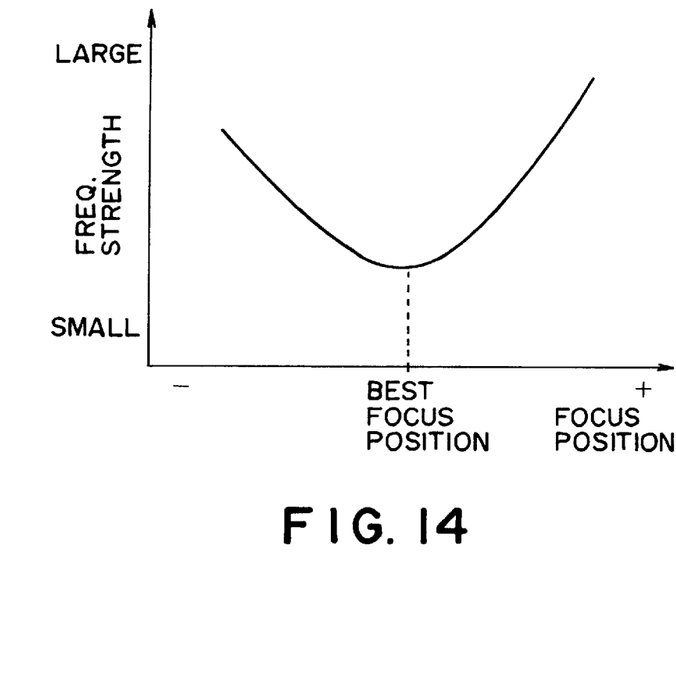
FIG. 14 is a graph of plot wherein the frequency strength is taken on the axis of the ordinate and the focus position is taken on the axis of the abscissa.

Therefore, it is possible to detect the optimum focal point position, by selecting a desired one of frequencies n times the basic frequency f1p and by detecting such focus position with which the power of that frequency becomes minimum. The relation between the focus position and the frequency strength (f3p) such as shown in FIG. 14 is obtainable, and the focus position corresponding to the minimum of the frequency strength there is the optimum focal point position.

As an alternative, the position as the ratio of the power of the frequency (f3p) selected there to the power of another basic frequency (e.g., g1p or g2p) becomes minimum, may be determined as the optimum focal point position. In this manner, by performing standardization with the power of other basic frequency in every shot, it is possible to reduce an error due to a difference between shots, for example, an error due to a difference in the quantity of reflected light resulting from a difference in thickness of resist or a difference in the quantity of illumination light.

Figure 10A:
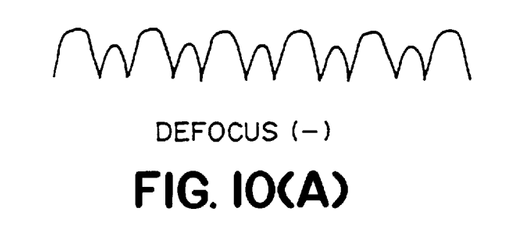
FIGS. 10(A)–10(C) show examples of projection and integration signals of images of patterns transferred with different exposure amounts, picked up by a CCD camera.
Figure 10B:
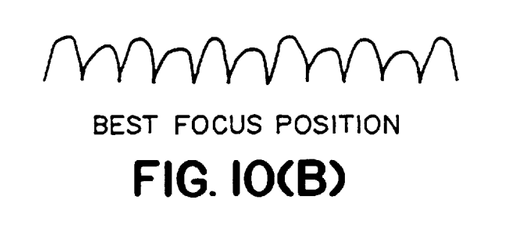
Figure 10C:
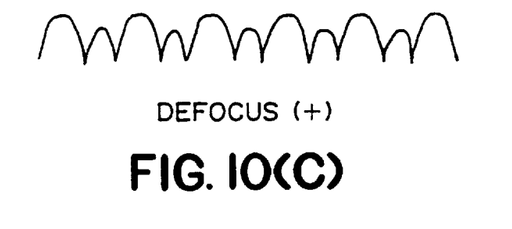
Figure 11:
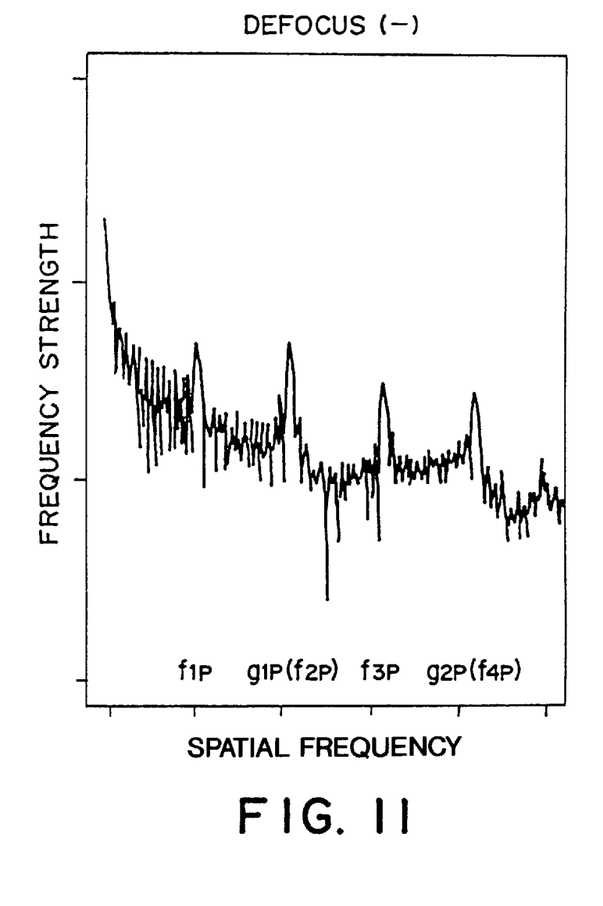
FIG. 11 is a graph wherein projection and integration signals of a pattern, transferred with a short exposure amount, as having been discrete-Fourier transformed through a FFT computing device, are plotted while taking the frequency strength on the axis of the ordinate and taking the spatial frequency on the axis of the abscissa.
Figure 12:
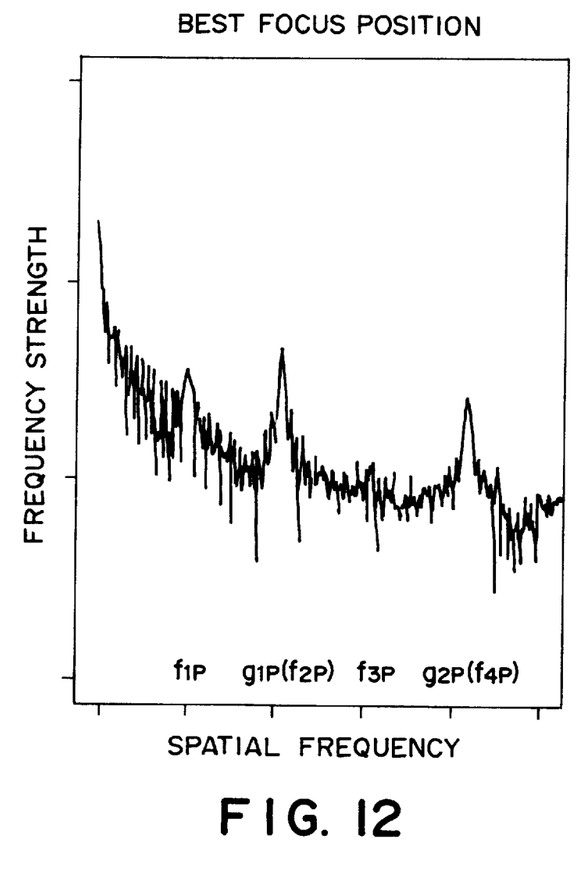
FIG. 12 is a graph wherein projection and integration signals of a pattern, transferred with an over exposure amount, as having been discrete-Fourier transformed through a FFT computing device, are plotted while taking the frequency strength on the axis of the ordinate and taking the spatial frequency on the axis of the abscissa.
Figure 13:
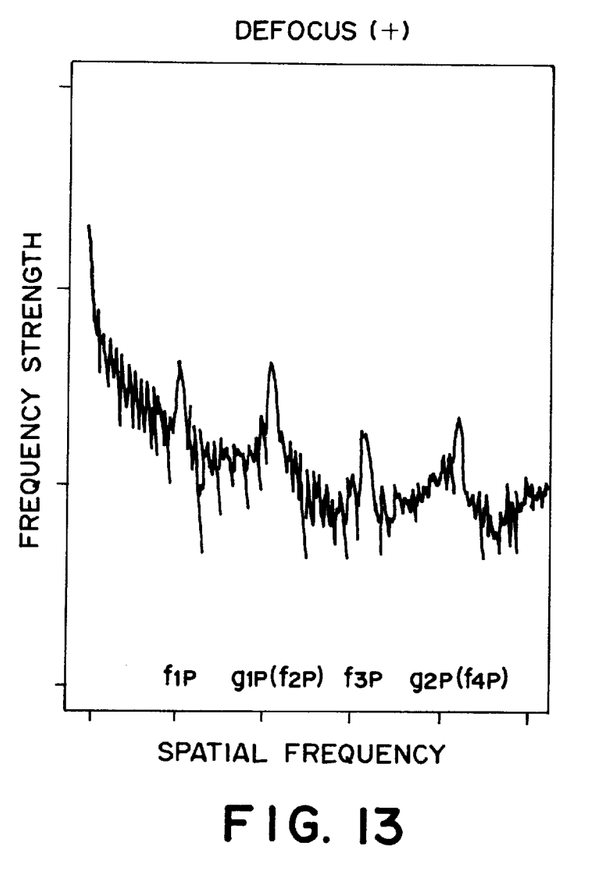
FIG. 13 is a graph wherein projection and integration signals of a pattern, transferred with a optimum exposure amount, as having been discrete-Fourier transformed through a FFT computing device, are plotted while taking the frequency strength on the axis of the ordinate and taking the spatial frequency on the axis of the abscissa.

FIGS. 10(A)–10(C) show examples of projection and integration signals provided by picking up the images of patterns printed with different exposure amounts. FIGS. 11–13 shows the results of discrete Fourier transformation made to the output signals through the FFT device. It is seen that, similarly to the focus control, the basic frequency strength of f1p and f2p becomes larger independently of the exposure amount.

Figure 15:
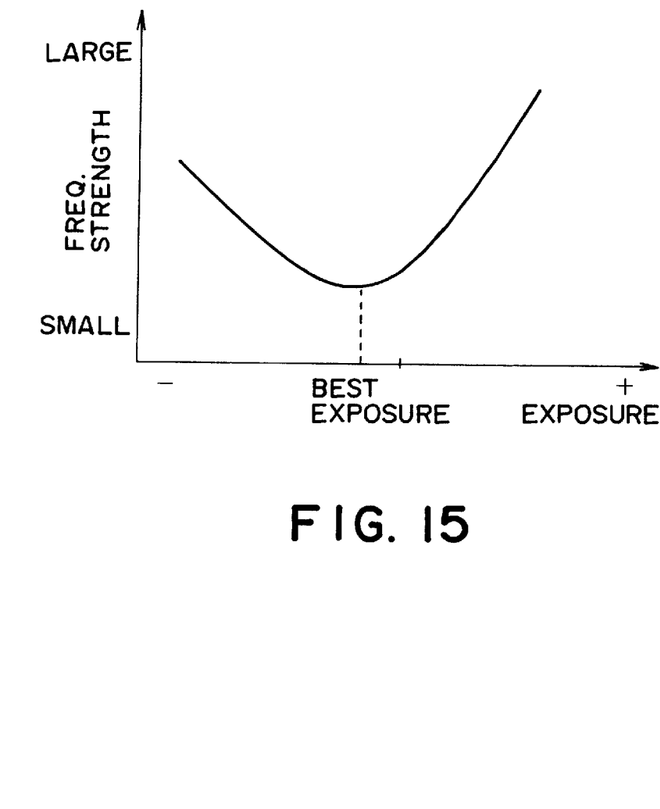
FIG. 15 is a graph of plot wherein the frequency strength is taken on the axis of the ordinate and the exposure amount is taken on the axis of the abscissa.

As regards the optimum exposure amount, like the optimum focal point position, it can be defined as the exposure amount with which the duty of the line and space comes closest to 1:1, that is, the power of the frequency component of f3p becomes minimum. FIG. 15 shows the frequency strength (f3p) as the exposure amount is changed. The exposure amount corresponding to the minimum of the frequency strength, is the optimum exposure amount. Of course, in every shot the standardization with the power of any other basic frequency may be done, as described.

In the case of optimum focal point position or optimum exposure amount, the duty of line and space becomes equal to 1:1 and thus the frequency strength of the basic frequencies g1p and g2p becomes maximum. Therefore, it may be defined as the focal point position or exposure amount with which the frequency strength of g1p or g2p becomes highest. Alternatively, comparison may be made to the powers of basic frequencies, e.g., g1p and g2p, and the optimum focal point position or optimum exposure amount may be determined at the moment a desired relation is established therebetween.

The calculated focus value may be fed back to the focus control device shown in FIG. 2, and by doing so, it is possible to hold the wafer (W) at the best focus position stably. Also as regards the exposure amount, it may be fed back to the integration exposure control device of FIG. 2 by which the optimum exposure amount can be set.

In the manner described, the optimum focal point position and the optimum exposure amount are calculated. In accordance with the type of a resist used and with a change in thickness thereof, the procedure described above is repeated and, by this, optimum exposure conditions are determined.

In the first embodiment described, resist patterns after development are detected. However, latent images before development may be detected and, in that occasion, it is still possible to determine the optimum focal point position and the optimum exposure amount. Where latent images are detected, the developing process can be omitted. Thus, automatic measurement of exposure conditions can be performed within the projection exposure apparatus, and this reduces the setting-up time remarkably.

Since the measurement pattern shown in FIG. 4 has pattern element disposed in the X and Y directions, respectively. Therefore, by detecting the optimum focus position in regard to the X and Y direction, at the same position, it is possible to detect astigmatism (astigmatic aberration) of the projection optical system. Namely, a predetermined two-dimensional window including the resist pattern of the pattern (My) such as shown in FIG. 5 may be set and, after this, picture element integration may be made within the window Wy along the Y direction in FIG. 5, whereby an electric signal train s(y) being discrete in the Y direction is outputted. Similarly, the applied electric signal train s(y) may be processed by discrete Fourier transformation, such that s(y) is transformed into a spatial frequency region. By detecting the Fourier coefficient, the focus detection in Y direction is attainable. By detecting the optimum focal point positions for the patterns having different directions, actual astigmatism of the projection lens as passed through the resist process can be measured.

Further, by providing measurement patterns at the center of the exposure region and plural positions along the outside periphery, it is possible to detect actual curvature of image plane and tilt of image plane of the projection lens as passed through the resist process. However, from the point of enhanced precision and also in respect to the FFT processing, the number of the line-and-space marks should desirably be large. At least ten or more is necessary.

In the procedure described, the power after the Fourier transformation is evaluated. However, by detecting the phase of it, it is possible to detect asymmetry of the resist pattern. This enables to measure comma (aberration of comma) of the projection lens at respective positions within the exposure amount region.

For detection of aberration of the projection lens such as described, it is not always necessary to use the same resist as to be used in the actual exposure of the circuit pattern. Any material being photosensitive may be used. As an example, a magneto-optic material or a photochromic material may be used.

In the first embodiment described, a reduction projection lens or an exposure apparatus is used both for printing measurement patterns on a wafer and for detecting resist patterns. However, for detection of resist patterns, a separate observation optical system may be used. This reduces the effect of aberration of the projection lens itself to the measurement results.

Further, while in the first embodiment the exposure conditions in relation to use of a projection optical system are determined, the exposure conditions to be determined may be those of proximity exposure process wherein no projection optical system is used. In that occasion, the spacing between the mask and the wafer may be changed.

While the invention has been described with reference to the structures disclosed herein, it is not confined to the details set forth and this application is intended to cover such modifications or changes as may come within the purposes of the improvements or the scope of the following claims.

What is claimed is:

1. A method of measuring an exposure condition for transfer of a pattern having a periodicity in a direction, onto a photosensitive substrate, said method comprising:

a pattern forming step for transferring the pattern onto the photosensitive substrate plural times in different exposure conditions, to form photosensitive patterns on the photosensitive substrate;

an image picking-up step for picking up images of the photosensitive patterns;

an integrating step for integrating each image signal produced by said image picking-up step, within a two-dimensional window of predetermined size set with respect to each image signal and along one direction parallel to fringe directions in two-dimensional coordinates, to produce one-dimensional projection integration signals;

a transforming step for transforming, through Fourier transformation, each of the one-dimensional projection integration signals into a spatial frequency region; and a determining step for determining an optimum exposure condition for transfer of the pattern onto the photosensitive substrate, on the basis of the frequency components, obtained by said transforming step, of each one-dimensional signal.

2. A method according to claim 1, wherein the photosensitive substrate comprises a wafer coated with a resist.

3. A method according to claim 1, wherein each of the photosensitive patterns comprises a resist pattern to be formed after a developing process.

4. A method according to claim 1, therein each of the photosensitive patterns comprises a latent image formed in a portion of a resist layer prior to a developing process.

5. A method according to claim 1, further comprising a second determining step for determining an optimum exposure condition, on the basis of a power of a basic frequency, of the frequency components of the photosensitive patterns, as determined by the periodic pattern.

6. A method according to claim 1, therein the exposure condition includes exposure amount as a parameter.

7. A method according to claim 1, wherein the pattern is transferred to the photosensitive substrate through a projection optical system, and wherein the exposure condition includes a position of the photosensitive substrate with respect to an optical axis direction of the projection optical system.

8. A method of measuring aberration of a projection optical system, comprising:

- a pattern forming step for transferring a pattern having a periodicity in a direction, of a reticle onto a photosensitive substrate through the projection optical system to form a photosensitive pattern on the photosensitive substrate;
- an image picking-up step for picking up an image of the photosensitive pattern;
- an integrating step for integrating an image signal produced by said image picking-up step, within a two-dimensional window of predetermined size set with respect to the image signal and along one direction parallel to fringe directions in two-dimensional coordinates, to produce a one-dimensional projection integration signal;
- a transforming step for transforming, through Fourier transformation, the one-dimensional projection integration signal into a spatial frequency region; and
- a determining step for determining the aberration of the projection optical system, on the basis of a frequency component, obtained by said transforming step.

9. A method according to claim 8, wherein the photosensitive substrate comprises a wafer coated with a resist.

10. A method according to claim 9, wherein the photosensitive pattern comprises a latent image formed in a portion of a resist layer prior to a developing process.

11. A method according to claim 8, wherein the photosensitive pattern comprises a resist pattern to be formed after a developing process.

12. A method according to claim 8, wherein the reticle has plural patterns to be transferred, and the patterns are disposed at different positions on the reticle.

13. A method according to claim 8, further comprising a second determining step for determining the aberration of the projection optical system, on the basis of a phase of the frequency component of the photosensitive pattern.

14. A method according to claim 8, further comprising a pattern forming step for transferring plural patterns on the photosensitive substrate at different positions being different with respect to an optical axis direction of the projection optical system, to form photosensitive patterns on the photosensitive substrate.

15. A method according to claim 14, further comprising a third determining step for determining a position of an image plane of the projection optical system, on the basis of a power of a basic frequency, of the frequency components of the photosensitive patterns, as determined by the periodic pattern.

* * * * *

UNITED STATES PATENT AND TRADEMARK OFFICE
CERTIFICATE OF CORRECTION

PATENT NO. : 5,814,425  
DATED : September 29, 1998  
INVENTOR(S) : Kataoka et al.

It is certified that error appears in the above-identified patent and that said Letters Patent is hereby corrected as shown below:

<u>COLUMN 2</u>:

Line 34, "patter" should read --pattern--;  
    Line 53, "including" should read --including:--; and  
    Line 55, "plural" should read --plural times--.

<u>COLUMN 3</u>:

Line 13, "still" should read --a still--.

<u>COLUMN 6</u>:

Line 13, "at there" should read --thereat--;  
    Line 37, "become" should read --becomes--; and  
    Line 60, "shows" should read --show--.

<u>COLUMN 7</u>:

Line 65, "is" should read --are--.

<u>COLUMN 8</u>:

Line 60, "therein" should read --wherein--.

UNITED STATES PATENT AND TRADEMARK OFFICE
CERTIFICATE OF CORRECTION

PATENT NO. : 5,814,425
DATED : September 29, 1998
INVENTOR(S) : Kataoka et al.

It is certified that error appears in the above-identified patent and that said Letters Patent is hereby corrected as shown below:

COLUMN 9:

Line 1, "therein" should read --wherein--.

Signed and Sealed this

Eleventh Day of May, 1999

*Attest:*

Q. TODD DICKINSON

*Attesting Officer*  Acting Commissioner of Patents and Trademarks